United States Patent [19]

Aichert et al.

[11] Patent Number: 4,572,776

[45] Date of Patent: Feb. 25, 1986

[54] MAGNETRON CATHODE FOR SPUTTERING FERROMAGNETIC TARGETS

[75] Inventors: Hans Aichert, Hanau am Main; Jörg Kieser, Albstadt; Reiner Kukla, Hanau, all of Fed. Rep. of Germany

[73] Assignee: Leybold-Heraeus GmbH, Cologne, Fed. Rep. of Germany

[21] Appl. No.: 678,597

[22] Filed: Dec. 5, 1984

[30] Foreign Application Priority Data

Dec. 5, 1983 [DE] Fed. Rep. of Germany ....... 3343904

[51] Int. Cl.$^4$ ............................................... C23C 14/34
[52] U.S. Cl. .................................................... 204/298
[58] Field of Search ......................................... 204/298

[56] References Cited

U.S. PATENT DOCUMENTS 4,198,283  4/1980  Class .................................... 204/298
4,299,678 11/1981  Meckel ................................ 204/298

*Primary Examiner*—T. M. Tufariello
*Attorney, Agent, or Firm*—Felfe & Lynch

[57] ABSTRACT

A magnetron cathode for sputtering ferromagnetic targets. The magnet system consists of magnet poles of opposite polarity lying one within the other disposed on a basic cathode body. Between the target and the pole shoes, which consist of target material, two circumferential air gaps in the direction of the depth of the system are formed. The surfaces of projection of the magnet poles and target do not overlap. For the purpose of making the target ablation uniform while simultaneously achieving high sputtering rates, the pole shoes are separated, in accordance with the invention, each by a distance S from the magnet poles. The magnet poles lie in an area which runs from a plane passing through the sputtering surface in the direction of the depth of the system. Between the pole shoes and the target, on the one hand, and the magnet poles on the other, there is disposed a thermally conductive metal body which is in communication with at least one coolant passage and consists of a nonferromagnetic material.

8 Claims, 11 Drawing Figures

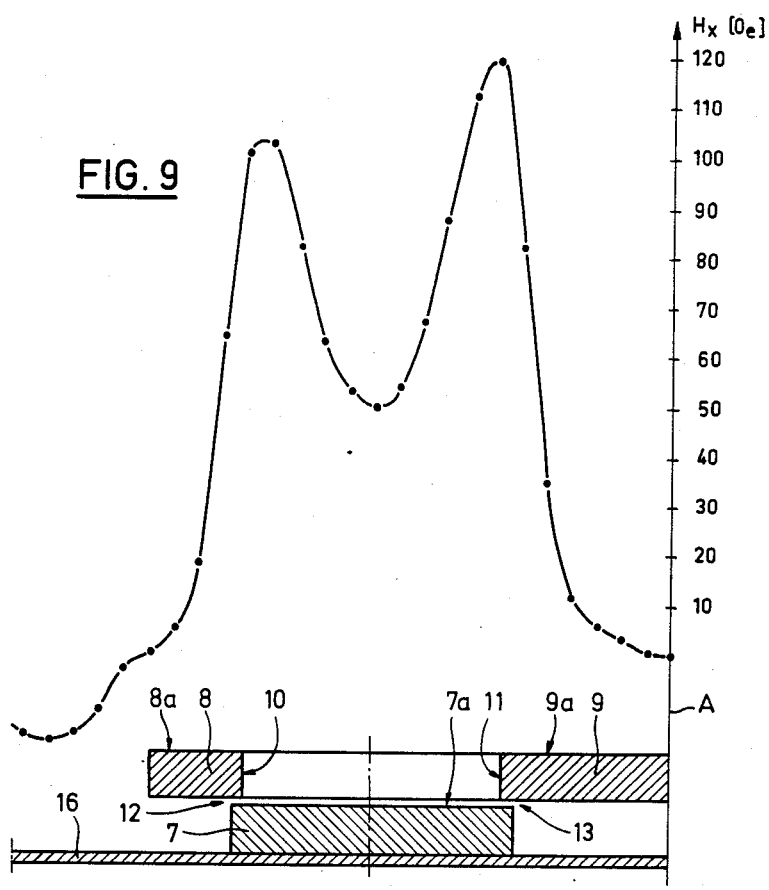
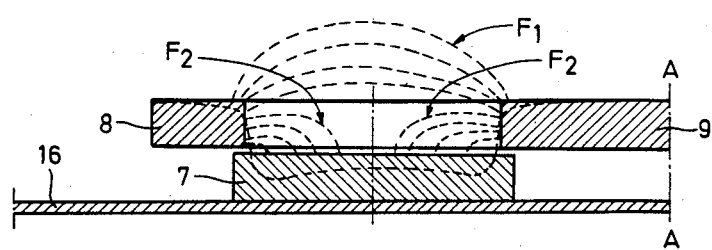
FIG. 10

MAGNETRON CATHODE FOR SPUTTERING FERROMAGNETIC TARGETS

BACKGROUND OF THE INVENTION

The invention relates to a magnetron cathode for sputtering ferromagnetic targets, consisting of a basic cathode body with a magnet system having a yoke and magnet poles of opposite polarity concatenated at the periphery and disposed one inside of the other on the yoke. The magnet poles are associated with pole shoes consisting at least partially of target material having emergence surfaces similar to the configuration of the magnet poles, and behind which, in the direction of the depth of the system, leaving two circumferential air gaps, a target is disposed which is concatenated at the periphery, composed of ferromagnetic metal, and has a sputtering surface; the magnet poles and target do not overlap in their surfaces of projection onto a plane parallel to the sputtering surface, and the pole shoes and the target are connected to one another in an electrically conductive manner.

Magnetron cathodes having planar or domed sputtering surfaces are sufficiently well known. In them there is provided a spatially defined arrangement of permanent magnets and/or electromagnets in such a position relative to the sputtering surface that an annular, closed tunnel of magnetic lines of force is produced over the sputtering surface, whereby the glow discharge producing the sputtering is limited to an area in the immediate adjacency of the sputtering surface and thus the sputtering rate is increased by more than a power of ten. The term "sputtering surface" refers to the effective target surface that is exposed to the glow discharge, and from which the sputtered particles emerge; this is the front surface of the target, as a rule (German publication AS No. 24 31 832).

Such magnetron cathodes have become known in a number of variants which either are of limited applicability and/or are not entirely adequate for the applications in which they would be desirable. Thus, in the known embodiment, the pole faces of the magnet system are disposed in back of the target, so that the majority of the magnetic lines of force penetrate the target face twice. Such a method of construction, however, either is not suitable, or is suitable only in conjunction with additional measures, for targets of magnetic materials, such as those needed, for example, for the production of magnetic recording tapes.

These measures can consist, for example, in making the target very thin, so that a sufficient number of magnetic lines of force can penetrate the target. This, however, necessitates frequent replacement of the target. Another possibility consists in operating the apparatus in the magnetic saturation region of the target material, but this requires extraordinarily strong magnet system, and it has not yet been possible to gain control of the distortions of the magnetic field, which change as the target material is increasingly consumed.

Furthermore, it is possible to heat the target material at a temperature above the specific Curie point, so that the magnetic lines of force can penetrate thicker target plates. The Curie temperatures are between about 400° and 1100° C., depending on the material, so that considerable thermal problems are involved in this approach. It is also known to facilitate the emergence of the lines of force by means of grooves in the target face (U.S. Pat. No. 4,299,678). Division of the face of the cathode into target and pole shoes by means of air gaps, however, is not provided, so that the effect is limited, and depends on the aid of temperature elevation.

U.S. Pat. No. 4,198,283 discloses a magnetron cathode in which the target, consisting of a plurality of portions, is gripped between soft-magnetic pole shoes. This substantially satisfies the requirement that the projections of targets and pole face onto a common plane parallel to the sputtering surface do not overlap. The method of gripping precludes any air gap parallel to the said plane. Thus the use of targets of ferromagnetic materials is excluded, because in such a case the magnetic lines of force would enter the target from the pole shoes in the transverse direction, so that the formation of a magnetic tunnel, or the magnetron effect, would not occur.

In a magnetron cathode disclosed by German Federal Pat. No. 30 12 935, the magnet poles of opposite polarity lie between common planes and at the same time they have in each case an endless, elongated-round configuration which can be called concentric. The magnetic lines of force between the inner and outer poles penetrate the distance between these poles. Within this distance there is disposed a geometrically similar, i.e., elongated-round target of the material that is to be sputtered. This arrangement, however, is suitable only for the sputtering of nonferromagnetic material. German Federal Pat. No. 30 12 935 also describes the possibilities for the sputtering of ferromagnetic targets by producing a second magnetic field by additional magnet devices. This second magnetic field is configured with respect to the first magnetic field and the sputtering surface such that the tendency of the first magnetic field to penetrate the magnetically permeable sputtering surface is substantially reduced. This arrangement is very expensive because of the additional magnet system required. Furthermore, the utilization of the plate-like target material would be extremely poor, so that this known method is intended for ferromagnetic target material in rod or bar form.

The German Federal publication OS No. 33 16 640, which was not prepublished, discloses a magnetron cathode in which one magnetic pole is disposed behind the central part of the target consisting of magnetic material. This central part is surrounded, leaving an air gap, by a peripheral target part which to a certain extent has the function of pole shoes. To the extent that the peripheral target part lies spatially in front of the central target part, like magnetic poles face one another in the air gap in front of the central target part, so that a closed tunnel of magnetic lines of force overlapping the central part cannot form. The magnetic lines of force, therefore, can enter the central target from the peripheral target part only in the area of the one circumferential air gap, while the maximum sputtering effect occurs precisely in the area of the air gap in whose vicinity relatively little sputtering material is located. In fact, special measures must be taken to see that material is not sputtered from the floor of the air gap, since in the case of a noncompatible material it would contaminate the deposited layers. With such a method material can be sputtered substantially only in the immediate adjacency of the air gap, so that the degree of material utilization is very low. The locally high magnetic field concentration in the area of the only air gap, which is detrimental to a large-area ablation of the target material, is even intensified by direct coupling of the target parts to the magnet poles through highly permeable components.

German Federal patent publication OS No. 32 44 691 discloses a magnetron cathode of the kind described above, in which the permanent magnets are disposed in a plane which is either formed by the sputtering surface of the target or lies in the sputtering surface at the commencement of the first sputtering process. In a variant of this principle, the permanent magnets lie in a plane in which the back of the target is situated. In all cases, the permanent magnets are situated in a zone of very great thermal stress. Since especially the present-day high-performance magnetic materials lose their magnetic properties in a temperature range between 150° and 200° C., which is easily reached in magnetron cathodes, it is stated in the disclosure that the system described must be cooled very effectively. Since, in connection with the prescribed direction of magnetization, the permanent magnets must not be of less than a specified axial length of about 8 to 10 mm, but on the other hand it is essential that the magnetic substance itself or any nonferromagnetic blocks mounted laterally thereof be not sputtered, the air gaps present at this point must not exceed a gap width of about 1 to 2 mm. Keeping these air gaps small, however, can be achieved, in view of the necessary length of the permanent magnets, only if the pole shoes are provided on their inner edges with collar-like prolongations. The lines of force emerging at the collar ends are deflected on a very short path into the target material from which, following the path of least resistance, they re-enter the opposite pole of the permanent magnets, since the ferromagnetic target, the ferromagnetic supporting plate and the permanent magnets are resting directly on one another without any air gaps. The consequence is a narrowing of the "magnetic trap" so that, instead of a large-area ablation of the target material, which is desirable in itself, two pit-like erosion zones result under the edges of the collars. The arrangement of the collars makes the manufacturing process considerably more expensive, which is disadvantageous inasmuch as the pole shoes themselves participate in the sputtering process, so that as a result they have a short life.

On the one hand, magnetron cathodes are greatly favored on account of their high specific sputtering output, but on the other hand the utilization of the target materials achieved on the basis of the magnetron principle is very poor. This is because, in the area of culmination of the magnetic lines of force, the plasma produces deeply eroded pits which too soon render the target unusable. An attempt has been made to remedy this by broadening the erosion pits: German Federal Pat. No. 25 56 607 has disclosed the idea of periodically shifting the pattern of the magnetic lines of force by superimposing a second, oscillating magnetic field. For the same purpose, German Federal publication OS No. 27 07 144 has disclosed the idea of shifting the magnet system periodically parallel to the sputtering surface. Lastly, German Federal publication OS No. 30 04 546 has proposed, for the improvement of the utilization of the target material, in a rotationally symmetrical magnetron cathode, to provide in addition to the main magnet system a plurality of secondary magnet systems by which the outwardly diminishing density of the lines of force of the main magnet system is said to be compensated. However, all of the above-described measures can be used only with targets of nonferromagnetic materials, because in the case of ferromagnetic materials the magnetic lines of force are unable to penetrate the material of targets having economically adequate thickness.

It is therefore the aim of the invention to improve a magnetron cathode of the kind described above such that this can be used economically, i.e., with a higher specific sputtering output and with a high utilization of material, on ferromagnetic target materials.

SUMMARY OF THE INVENTION

The invention achieves the aim of the initially described magnetron cathode by separating the pole shoes from the magnet poles each by a distance S within which a nonferromagnetic medium is situated, by situating the magnet poles in an area extending, in a manner known in itself, in the direction of the depth of the system from a plane passing through the sputtering surface of the target, and by disposing between the pole shoes and the target on the one hand and the magnet poles on the other a thermally conductive metal body which is in communication with at least one coolant passage and consists of a nonferromagnetic material.

The distance S is not necessarily the total distance between the bottom of the pole shoes and the magnet poles (ferromagnetic flux guiding bodies, for example, can be situated in part of this total distance), but a "gap" situated outside of ferromagnetic materials.

It is important that two air gaps extending in the direction of the depth of the system be formed between the confronting emergence surfaces of the pole shoes and the target. The target is set back in the direction of depth from the pole shoes, so that most of the magnetic lines of force emerge from the pole shoes above the sputtering surface. This feature is to be seen in direct connection with the statement relating to the prior art to the effect that the projections of the magnet poles and target onto a plane parallel to the sputtering surface do not overlap, so that air gaps are also formed at this location.

Also important is the fact that, in contrast to German Federal publication OS No. 33 16 640, opposite magnet poles confront one another in the air space in front of the annular target or in front of the two air gaps, so that the magnetic lines of force can form a "bridge" over the target. In other words—and this is in contrast to German Federal publication OS No. 32 44 691—it is not that the magnetic lines of force reenter the target on a relatively short path beyond the spanned air gap and flow out of it again against low magnetic resistance, back to the opposite poles of the permanent magnets. Instead, this path is provided with a very high magnetic resistance by disposing the target and the magnetic poles such that the surfaces of their projection onto a plane parallel to the sputtering surface do not overlap, but in an especially advantageous embodiment they even lie within one another with a spacing x, and no magnetically highly conductive connection exists between target and magnets.

The distance S between the pole shoes and the magnet poles serves two very important functions in the system of the invention:

1. It provides for the thermal uncoupling of the heat-sensitive permanent magnets from the hot sputtering target and thus makes possible high power densities and, in turn, very high sputtering rates.

2. It acts as an air gap, even if the distance "S" should be wholly or partially taken up by an nonferromagnetic medium such as copper. Thus, the entire magnetic flux does not pass into the pole shoes, and a scattering effect is produced. A portion of the magnetic lines of force enter into the pole shoes, and another portion enters into the lateral surfaces of the target. This has the following effect:

Due to the relative dimensioning of the air gaps disposed in the direction of the depth and transversely thereof, the part of the magnetic flux running through the target can be varied in relation to the part of the flux ("bridge") that passes over the target. This in turn has a direct influence on the geometrical configuration of the magnetic lines of force and hence of the plasma trap and of the distribution of the target consumption. As it will be shown later on in the detailed description, conditions can easily be optimized, so that the sputtering surface will remain approximately flat even as the consumption of the target material advances, so that a target utilization of better than 50%, far in excess of the state of the art, is the result.

By setting the magnet poles in back of the sputtering surface of the target, especially by placing the magnet poles in back of the thermally conducting metal body on whose front side the target and pole shoes are situated, it is brought about that not only is the magnet system not disposed in the area of high thermal stress, but in fact can be cooled much more intensively by simple measures. Thus there is no limit to the selection of magnetic materials.

Furthermore, it is not necessary to provide the pole shoes with collars in view of the depth of the permanent magnets, so that the pole shoes can be manufactured inexpensively by cutting them out of a material in plate form. This simultaneously eliminates the undesirable leading action of the collar-like projections on the magnetic flux.

Thick targets of ferromagnetic materials can be sputtered by means of the magnetron cathode of the invention. This possibility is provided especially because magnetic saturation of the target material is unnecessary. Connected with this is an extremely long life of the magnetron cathode between target changes. Nevertheless, a high sputtering rate is possible, as would be impossible with thick ferromagnetic targets without the use of the apparatus of the invention.

Additional advantageous developments of the subject matter of the invention are described in the subordinate claims and further explained in the detailed description that follows.

BRIEF DESCRIPTION OF THE DRAWINGS

Examples of the embodiment of the invention are explained in detail below with the aid of FIGS. 1 to 11, wherein:

FIG. 9 is an enlarged detail of the left half of FIG. 8, together with a diagram representing the horizontal component (Hx) of the magnetic field strength at a distance of 2 mm above the pole shoe surface, in relation to the radial dimensions of the magnetron, FIG. 10 is a representation similar to FIG. 9, but showing an "erosion profile" (broken line)

DETAILED DESCRIPTION OF THE INVENTION

Figure 1:
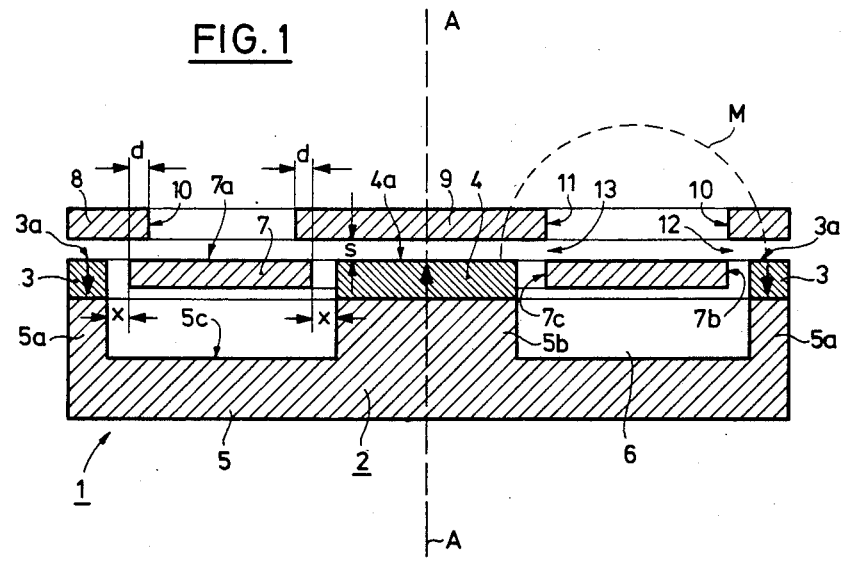
FIG. 1 shows a diagrammatic axial section through the essential parts of the magnetron.

In FIG. 1 there is represented a magnetron cathode having a basic cathode body 1 whose essential part is a magnet system 2. The expression, "basic cathode body", used herein, is to be understood to refer to that part of the cathode which serves as a support for the rest of the components and to which the cathode is fastened within a vacuum chamber which is not shown. The magnet system consists of a defined arrangement of permanent magnets 3 and 4, which are joined directly, without an air gap, to a magnet yoke 5. The direction of magnetization is indicated in the permanent magnets by arrows, and it can be seen that the permanent magnets 3 and 4 have opposite directions of magnetization in line with the limbs 5a and 5b of the magnet yoke 5. The magnet poles 3a and 4a are thus formed, which are in a common plane.

The permanent magnets 3 form a system concatenated along the circumference, which can be composed preferably of individual permanent magnets. The permanent magnets 3, in a rotationally symmetrical system whose axis is identified as A—A, lie in a tight arrangement about the circumference of an annular surface formed by the top side of the limb 5a.

Figure 2:
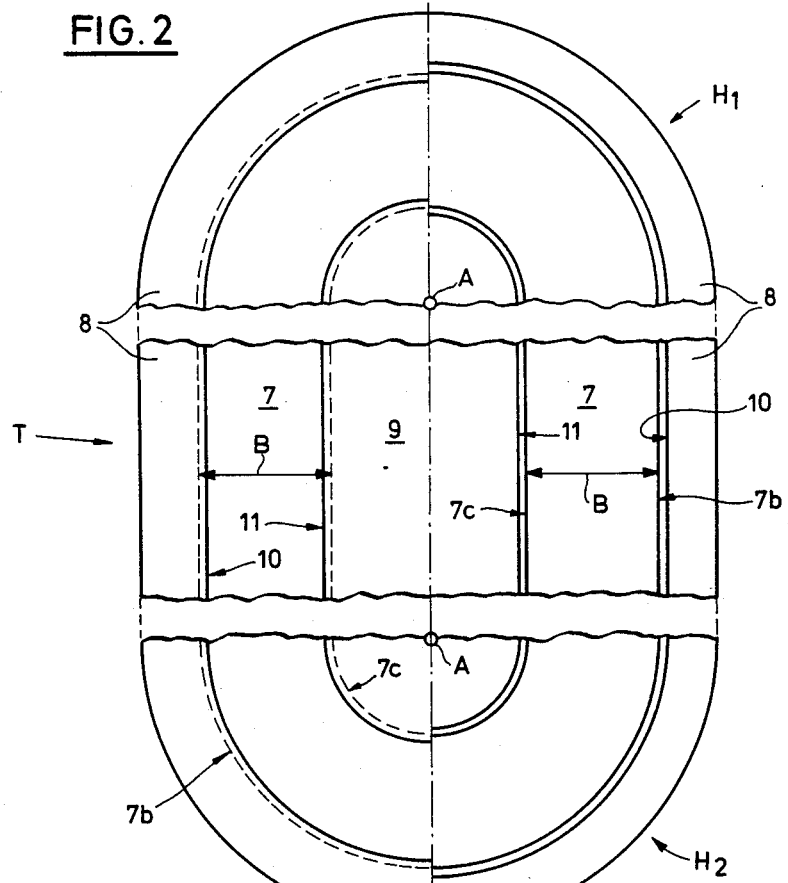
FIGS. 2 and 3 are plan views of different forms of the magnetron and its possible variants.
Figure 3:
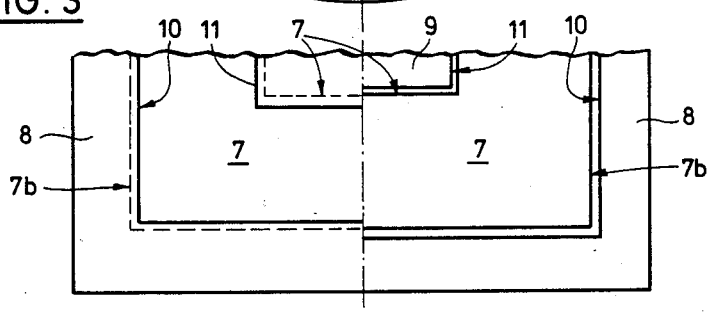

It is also indicated, with the aid of FIGS. 2 and 3, that the invention is not limited to a rotationally symmetrical system, but can also be embodied in so-called oval or rectangular cathodes. To simplify the description, however, the following explanations relate to a rotationally symmetrical system.

The magnet yoke 5 has an "E" shape in cross section but is cup-like. The permanent magnet 4, which can be in one piece in the form of a short cylinder, rests on the top surface of the limb 5b. (In the case of an elongated configuration as in FIG. 2, however, the inner permanent magnet can also be composed of several pieces of identical direction of magnetization.)

In the manner described, the magnet poles 3a and 4a form an arrangement that is concatenated along the circumference and is concentric in the case of FIG. 1. That is, magnet poles of opposite polarity are opposite one another on the inside and outside, and, when ferromagnetic materials are not present in the vicinity of the magnet poles, lines of force emerge perpendicularly from the one magnet pole and, after running through an accurate path, re-enter the other magnet pole. Such a line of force is represented on the right in FIG. 1, and is marked M. When ferromagnetic materials are present in the vicinity of the magnet poles, however, the conditions are basically different.

Between the permanent magnets 3 and 4 and the limbs 5a and 5b aligned therewith, lies a hollow cylindrical cavity 6 which is formed at the bottom by the upper, annular surface 5c of the magnet yoke 5. In this cavity 6 lies a likewise annular target 7 within two lateral gaps x; this target can also be composed of sections. Permanent magnets and targets composed of sections are in any case referred to as being "concatenated along the circumference". The face of target 7 that serves for coating purposes is its upwardly (or outwardly) facing sputtering surface 7a.

On the basis of the selected arrangement and the maintenance of the gaps x, the condition is fulfilled that magnet poles 3a and 4a as well as target 7 do not overlap but are situated within one another with the said spacing x.

It is important in the present case that the target 7 consist of a ferromagnetic material. Without the presence of magnetic pole shoes, the result of this would be that the magnetic lines of force would penetrate into the target along the shortest possible path, so that the desired distribution of lines of force known heretofore in nonferromagnetic targets cannot be achieved, as is represented on the right in FIG. 1 by the broken line M. In this way, however, the so-called "magnetron effect" cannot be established, so that only the common, very low sputtering rate would be achieved that is known is so-called "diode systems".

Now, in accordance with the invention, pole shoes 8 and 9 are associated with the magnet poles 3a and 4a, and their surfaces of projection onto a plane parallel to the sputtering surface are an annular surface and a circular surface, respectively. These pole shoes 8 and 9 consist at least in part, i.e., at their upwardly and outwardly facing surfaces, of the same material as the target 7—in other words they are ferromagnetic. This is because the pole shoes are subject—even though only slightly—to a sputtering process in the area of their surfaces of emergence (FIG. 10), so that the material of the pole shoes also deposits itself on the substrates. However, in no way is there any disadvantage in this identity of material. In the most favorable case, the target and pole shoes can be made of one and the same plate of ferromagnetic material, for example by stamping or flame cutting, so that an optimal utilization of material is possible. In the course of time, however, the sputtering of the pole shoes does not involve any displacement of the surface of emergence. For it has been observed that the sputtering of the surfaces of emergence is largely compensated by the fact that material sputtered away from the target is deposited on the emergence surfaces of the pole shoes, so that the pole shoes are protected by a dynamic equilibrium between sputtering off and sputtering on.

The pole shoes 8 and 9 are disposed at a distance s from the magnet poles 3a and 4a, so that this point provides a possibility for the magnetic optimization of the system. This is because it depends on the ratio of the distances x : s, among other things, as to which portion of the magnetic lines of force of the magnet poles 3a and 4a enters into the target and which portion enters into the pole shoes 8 and 9. The distance x will be made of the same order of magnitude as the distance s, both distances being in the range of a few millimeters. If the distance s is increased, a greater part of the magnetic flux made available by the permanent magnets at the margins of the target 7 will penetrate into the latter. But if the distance s is decreased, the portion of the flux that is carried by the pole shoes 8 and 9 will increase.

Figure 8:
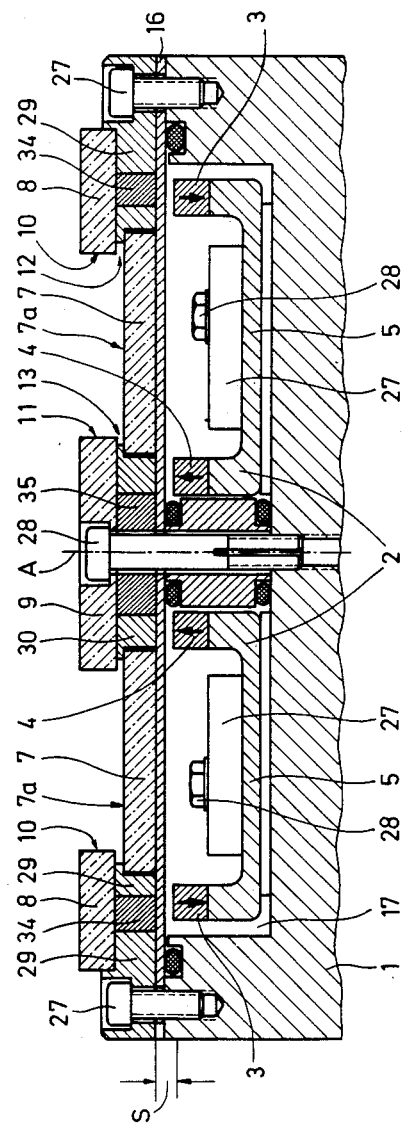
FIG. 8 is an axial section through a variant of the magnetron of FIG. 4, in which the thermally conductive metal body is placed between the target and the magnet system, in the form of a flat plate.

In the present case, the sputtering surface 7a lies in the same plane as the surfaces of the magnet poles 3a and 4a. However, departures from this position are possible, and can likewise be utilized for the optimation of the system (FIGS. 8 to 10).

By "optimation" is meant the designing of the system for a maximum sputtering rate combined with a very uniform ablation of the target material from the sputtering surface 7a. Whether these requirements are fulfilled can be determined by relatively simple experiment: a target 7 is sputtered for several hours or days, and then the remaining geometry of the target 7 is measured. By varying the distances x and s relative to one another as described above, a correction can be made in the sense indicated.

Figure 6:
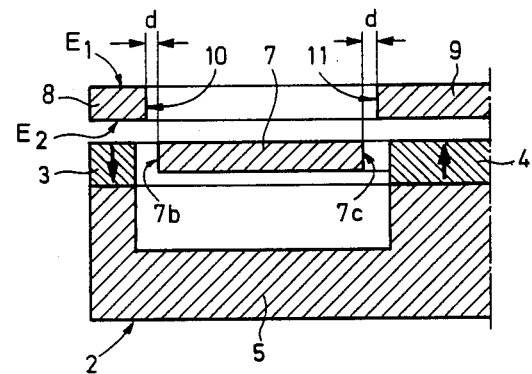
FIG. 6 is a diagrammatic axial section similar to FIG. 5, but with negative overlap "d"
Figure 7:
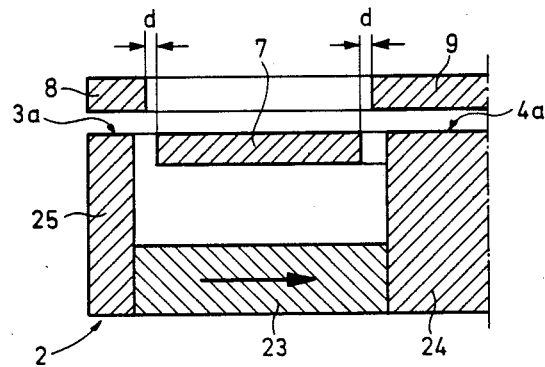
FIG. 7 is a diagrammatic axial section similar to FIG. 6, but with the arrangement of permanent magnets reversed.

Another parameter for the optimization of the system is the degree of overlapping d. The overlap can be positive, as indicated on the left in FIG. 1, i.e., the projection surfaces overlap in a common plane parallel to the sputtering surface 7a. The overlap, however, can also amount to d=0, as shown on the right in FIG. 1; the overlap d can also be negative, as shown in FIGS. 6 and 7, i.e., the above-mentioned projection surfaces not only do not overlap one another, but are separated from one another. The case shown in FIGS. 6 and 7, of a negative overlap, even though it be quite small, has the advantage that the target, which is consumed substantially faster than the pole shoes, can be replaced without disassembling the pole shoes, thereby drastically shortening the down time of the apparatus.

On the basis of the system represented in FIG. 1, the pole shoes 8 and 9 have emergence surfaces 10 and 11 which are continuous on the circumference and whose imaginary generatrix is perpendicular to the sputtering surface. The configuration of the emergence surfaces on their circumference is geometrically similar to the configuration of the magnet poles and the margins of the target, i.e., the distances x and the size of the positive or negative overlap d are equal over the entire circumference. Furthermore, on each side of the axis A—A in the direction of the depth of the system, the described two air gaps 12 and 13 exist between the target 7 and the pole shoe 9, between the target 7 and the pole shoe 8 on the one hand, and between the target 7 and the pole shoe 9 on the other, whereby the magnetic flux is forced to emerge at least partially from the emergence surfaces 10 and 11 and to follow the course described above.

The target 7 has on both sides of the sputtering surface 7a two cylindrical and therefore circumferential side surfaces 7b and 7c, which in general have the above-described geometrically similar shape, but in the special case of FIG. 1, right, in projection onto a plane parallel to the sputtering surface 7a they are congruent with the emergence surfaces 10 and 11.

Sections of magnetron cathodes having different geometrical forms are represented in FIG. 2 in a top plan view of the sputtering surface of the target 7. The target width is indicated in each case by the double-headed arrow B. In the left half, target 7 and pole shoes 8 and 9 have a positive overlap d in accordance with FIG. 1, left, and FIG. 5. Consequently the side surfaces 7b and 7c of the target are concealed and indicated in phantom by broken lines. In the right portion of FIG. 2, between the target 7 and the pole shoes 8 and 9, there is a negative overlap in accordance with FIGS. 6 and 7, so that the side surfaces 7b and 7c are visible, as are the emergence surfaces 10 and 11. This kind of representation is used also in FIG. 3.

In FIG. 2, the halves H-1 and H-2 of a magnetron cathode in accordance with FIG. 1 are represented at the top and bottom, respectively, i.e., the joining of the two halves H-1 and H-2 results in a rotationally symmetrical magnetron having the common axis A—A in FIG. 1. If between the two halves H-1 and H-2 a rectilinear part T is inserted, in which all of the side surfaces, emergence surfaces and air gaps continuously merge with the corresponding portions of the rotationally symmetrical halves, the result will be an elongated magnetron cathode of virtually any desired length. Such magnetron cathodes can be made in lengths of about 4 m, so that they can be used also for the coating of large-area substrates such as, for example, architectural glass. The curve of the plasma captured by the magnet fields then corresponds to the shape of the target 7, so that the term "racetrack" is used to refer to the enclosed area in which the plasma forms.

It is not necessary, however, to make the ends of an elongated magnetron cathode rotationally symmetrical as in FIG. 2; instead, these ends can also be made squarecornered, as represented in FIG. 3.

Figure 4:
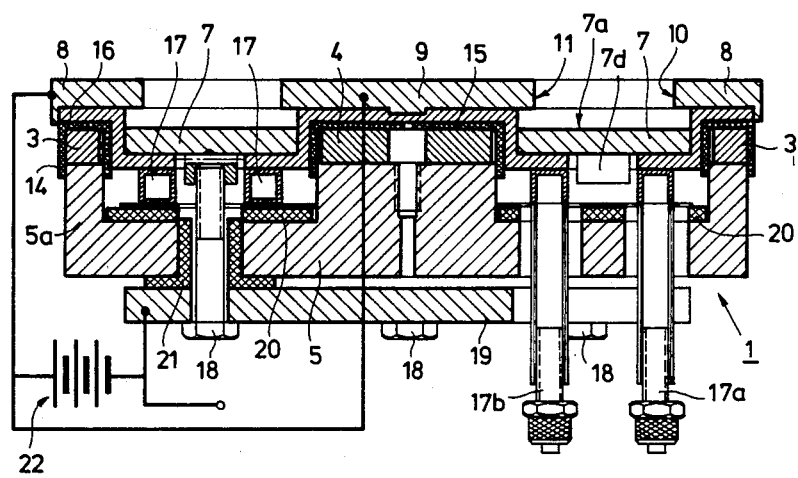
FIG. 4 is an axial section similar to FIG. 1, but in combination with additional components, i.e., a special embodiment.

In FIG. 4, parts that are the same as shown in FIG. 1 are provided with the same reference numbers. It can be seen that the magnet system 2, especially the permanent magnets 3 and 4, is surrounded by insulation coverings 14 and 15 which are intended to produce a potential separation between the target 7 and pole shoes 8 and 9 on the one hand and the basic cathode body 1 on the other. Between the pole shoes 8 and 9 and the target 7, on the one hand, and the magnet poles 3aa and 4a with the magnet yoke 5 on the other, there is lastly disposed also a thermally conductive metal body 16 which is connected to a coolant passage 17. The coolant passage 17 consists of a double, wound tube of square cross section which is soldered flat to the metal body 16. The metal body has, as indicated, a W-like cross section, so that the spacing and air gaps described above are provided for. The term, "air gaps", refers also to those spaces within the magnet system which are filled with nonferromagnetic materials, such as insulation material covers 14 and 15 and the metal body 16, which can consist of aluminum, copper or nonmagnetic steel, for example.

Since the target 7 as well as the pole shoes 8 and 9 are at a relatively high potential and are connected to the metal body in an electrically conductive manner, the two terminal ends 17a and 17b of the coolant passage 17 must be carried through the basic cathode body 1 with an appropriate insulating gap.

The target 17, together with the metal body 16 and the coolant passage 17, is clamped by means of a plurality of bolts 18 against the basic cathode body 1. This is done with the interposition of a pressure plate 19 which simultaneously serves as the terminal (not shown) for the cathode voltage. The necessary voltage insulation is accomplished by means of interposed insulating bodies 20 and 21. In contrast to FIG. 1, the target 7 has on its back a plurality of bushings 7d each having a thread for the bolts 18.

Although target 7 and pole shoes 8 and 9 are generally at the same potential (cathode potential), it is possible to provide a potential difference (relative voltage) also between the target on the one hand and the pole shoes on the other. For this purpose still another voltage source 22 is disposed between the pressure plate 19, to which the main supply voltage is applied, and the pole shoes 8 and 9, and this voltage source produces the desired potential positive or negative difference between 10 and 100 volts. It is understood that, in this case, target 7 and pole shoes 8 and 9 must be insulated from one another. This can be accomplished simply by the interposition of additional insulating bodies which are borne on the metal body 16 at suitable points, which are not separately indicated in FIG. 4.

Figure 5:
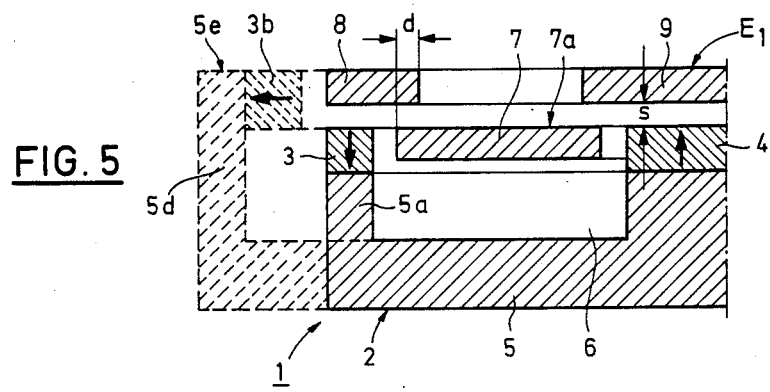
FIG. 5 is a diagrammatic axial section similar to the left half of FIG. 1 through a magnetron with a variant in which the magnet poles externally surround the pole shoes.

FIG. 5 shows in solid lines a system which is the same as that in FIG. 1, left half. However, a variant is represented on the outside left, which has the following subject: The magnet yoke 5 is radially enlarged while the dimensions of pole shoes 8 and 9 remain the same, and in the axial direction it has a longer limb 5d whose annular surface 5e lies in the same plane E-1 in which the upper defining surfaces of the pole shoes 8 and 9 are situated. On this (circumferential) limb 5d there is attached radially inwardly a magnet 3b which corresponds to the magnet 3, but is opposite the outer cylindrical surface of the pole shoe 8. This makes the distance from the target 7 greater, so that a greater proportion of the magnetic flux enters the pole shoe 8. The overlap d is positive in FIG. 5.

FIG. 6 shows a similar arrangement, except that in this case the overlap d is negative, as described above. As already described above, this facilitates the construction of the target 7, since the latter can be removed upwardly through the interstice between the pole shoes 8 and 9. It is also especially to be noted that the two pole shoes 8 and 9 of opposite polarity lie between the same planes E-1 and E-2.

FIG. 7 again shows a similar arrangement, also with a negative overlap d. Here, however, another change has been made in the magnet system: the position of the magnet yoke and of the permanent magnets has been changed about. In this case, the magnet yoke is not continuous, but at this point there is a permanent magnet 23 which is radially magnetized in accordance with the arrow. The pole faces are in communication with a cylindrical, ferromagnetic core 24 and with a ferromagnetic hollow cylinder 25 on whose upper surfaces the magnet poles 4a and 3a, respectively, are formed. The course of the magnetic flux in this case is substantially the same as in the foregoing embodiments. Embodiments are also conceivable in which the magnet system 2 consists of one piece of a hard-magnetic material which is magnetized in a suitable manner.

With the magnetron cathode described above, targets of iron are sputtered at average sputtering rates of about 9.0 nm/sec at a specific electrical power of 25 W/cm$^2$. The target ablation was at the same time extraordinarily uniform over the entire sputtering surface (cf. FIG. 10). In those experiments, the pole shoes and the targets consisted of soft iron parts 10 mm thick, in which the magnetic flux was far below magnetic saturation. The sputtering atmosphere consisted of argon at a pressure between $8 \times 10^{-4}$ and $10^{-2}$ mbar. Other possible materials are, for example, Permalloy, and CoCr alloy (e.g. 80/20).

In FIG. 8, parts that are the same, or parts serving the same functions, as heretofore, are given the same reference numbers. In the case here represented, the basic cathode body 1 is not identical with the magnet yoke, but is in the form of an additional hollow body, and is closed by the metal body 16, which here is in the form of a plane-parallel plate of a nonmagnetic material (copper). The seal against the basic cathode body 1 is produced by means of O-rings not further identified, and bolts 27 and 28. Between the metal body 16 and the basic cathode body 1 there is a coolant passage 17 in which the permanent magnets 2 and 4 as well as the magnet yoke are housed. The fastening is accomplished by means of insulating bodies 27 and bolts 28.

On the planar exterior of the metal body 16 are disposed the annularly continuous target 7 as well as the central pole shoe 9 and the peripheral pole shoes 8. In order in this case to maintain, in the direction of the depth of the magnetron, the two air gaps 12 and 13 which follow the shape of the target margins, the pole shoes 8 and 9 are fastened on spacers 29 and 30 which have a thickness that is greater by the width of the air gaps 12 and 13 than the thickness of the target 7. Since the distance between the pole shoes 8 and 9 and the corresponding magnet poles of the permanent magnets 3 and 4 is thus increased, the distance between the top of the metal body 16 and the bottom of the pole shoes 8 and 9 is spanned by ferromagnetic bodies 34 and 35, which are disposed within the spacers 29 and 30 consisting of nonmagnetic material. The outer bodies 34 and the inner bodies 35 are, in the case of rectangular cathodes, in the form of strips whose shape follows the shape of the pole shoes 8.

It can be seen in FIG. 8 that the distance S is made up of the thickness of the metal body 16 and of the distance existing between the magnet poles and the inside of the metal body 16. As already stated above, the maintenance of such a distance, which represents a magnetic resistance of considerable magnitude, is important with regard to the flux distribution between the target 7 on the one hand and the pole shoes 8 and 9 on the other.

From FIG. 8 it is to be seen that the projections of the permanent magnets 3 and 4 and of the ferromagnetic bodies 34 and 35 onto a common plane parallel to the target surface 7a does not need to be congruent. Instead, a considerable lateral offset is possible, as shown. In this manner, too, the relative proportions of the magnetic flux entering the target 7 on the one hand and re-entering the pole shoes 8 and 9 on the other can be changed, while a magnetic short circuit between the ferromagnetic bodies 34 and 35 and the target 7 must be prevented under all circumstances. For this reason a corresponding section of the spacers 29 and 30, made of nonmagnetic material, is provided between the ferromagnetic bodies 34 and 35 and the target 7.

In FIG. 9, only the target 7 and the pole shoes 8 and 9 from FIG. 8 are represented above the planar metal body 16, and the position of the air gaps 12 and 13 can also be seen in relation to the sputtering surface 7a. The axis of the magnetron is marked A, i.e., only the portions of half of a magnetron are represented.

The curve of the horizontal components Hx of the magnetic field strength is plotted in the upper part of FIG. 9 in precise radial relationship to the axis A; this is the field strength at a distance of 2 mm above the pole shoe surface 8a and 9a. It can be seen that the horizontal components in the area of the emergence surfaces 10 and 11 have a maximum for each. Between the maxima, however, the curve does not at all pass through zero, but even at the point of the minimum, which is over the center of the target cross section, a considerable horizontal component is still present. The part of the curve between the two peaks is proof of the existence of a "bridge" of magnetic lines of force F-1 spanning the target 7, which are present in addition to the lines of force F-2 entering directly into the target 7 (FIG. 10).

This bridge is comparable to the "magnetic tunnel" present in the planar magnetron of the prior art. This assures an effective injection of plasma in the entire area of the target, which results in the extremely flat erosion profile observed (cf. FIG. 10).

It is to be stressed that the ferromagnetic bodies 34 and 35 are present also in the arrangement in accordance with FIG. 9. Experiments which were performed with the omission of the outer ferromagnetic bodies 34 do not give the same favorable result as the experiments performed with an arrangement as in FIG. 8. On account of the outer ferromagnetic bodies 34, the magnetic field, especially in the center of the target cross section and at the outer margin of the target, is decidedly strengthened, so that a more uniform ablation of the target material resulted. This was seen also in the optical observation of the plasma which, at a pressure of $5 \times 10$ mbar, was distributed almost uniformly over the entire width of the target. With respect to the sputtering surface 7a, a specific sputtering power of 22.0 W cm was sustained in constant operation.

In FIG. 10, parts of the apparatus identical to those shown hatched in FIG. 9 are represented before the start of the first sputtering process. The broken line shows the position of the surfaces of the pole shoes 8 and 9, on the one hand, and of the target 7 on the other, after the magnetron cathode has been in use for a period totaling 82 hours. It can be seen that the consumption of the target material has a virtually uniform average over the entire target cross section, and especially that the unwanted V-shaped erosion pits which are created even by the sputtering of nonferromagnetic materials have not been produced. This is all the more remarkable since no additional aids are here provided for the mechanical or electrical shifting of the magnetic field.

Figure 11:
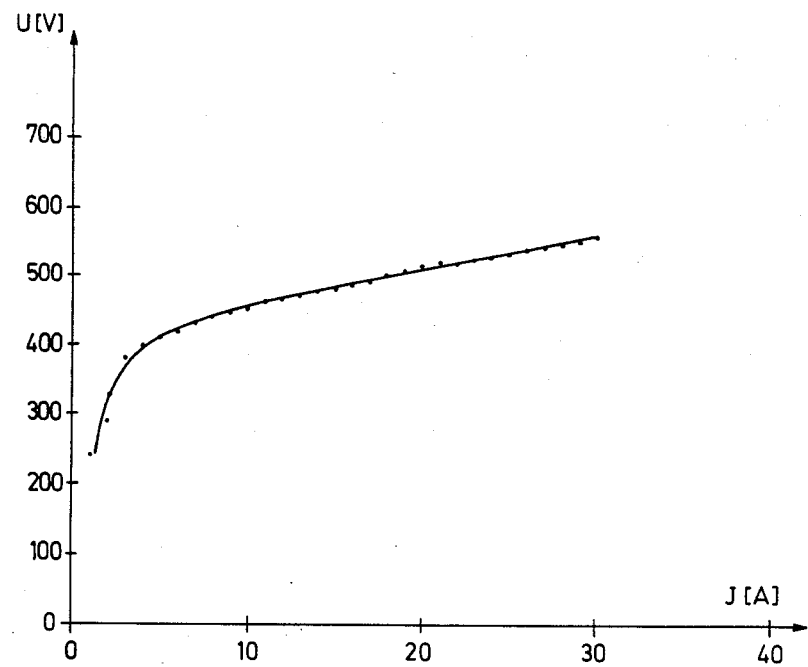
FIG. 11 presents the characteristic curve of the magnetron of FIG. 8.

FIG. 11 shows a typical magnetron chracteristic curve such as was obtained in the operation of the magnetron of FIG. 8 at an argon pressure of $5 \times 10^{-3}$ mbar. Beginning at a voltage of about 400 V, the cathode current I could be considerably increased by a relatively slight voltage increase with a linear relationship, which is common for the operation of planar magnetrons with nonferronmagentic targets. The end point of the characteristic curve indicated correspond to an average power density at the target of 22 W cm$^{-2}$.

What is claimed:

1. In a magnetron cathode for sputtering ferromagnetic targets, the improvement comprising providing the basic cathode body with a magnet system comprising a yoke and magnet poles of opposite polarity disposed on the yoke, concatenated on the circumference and lying one inside the other, with which poles, pole shoes consisting at least partially of target material and having emergence surfaces similar to the configuration of the magnet poles are associated, behind which emergence surfaces is deposed in the depth direction of the system, leaving two circumferential air gaps, a target of ferromagnetic metal concatenated on the circumference and having a sputtering surface, said magnet poles and target not overlapping in regard to their projection surfaces in a plane parallel to the sputtering surface, and said pole shoes and target connected electrically with one another, and said pole shoes being separated from the magnet poles each by a distance "S" in which a nonferromagnetic medium is situated, and the magnet poles being positioned in an area which extends in the depth direction of the system from a plane passing through the sputtering surface of the target, and deposed between the pole shoes and the target on the one hand and the magnet poles on the other, a heat-conducting metal body, which body is in communication with at least one coolant passage and which body consists of a nonferromagnetic material.

2. The magnetron cathode of claim 1, wherein the surfaces of the pole shoes facing the target are planar.

3. The magnetron cathode of claim 1, wherein the emergence surfaces of the pole shoes are aligned substantially perpendicular to the sputtering surface.

4. The magnetron cathode of claim 1, wherein the projections of the emergence surfaces of the pole shoes and of the circumferential side surfaces of the target onto a plane parallel to the sputtering surface are substantially congruent pair-wise.

5. The magnetron cathode of claim 1 wherein the projections of the emergence surfaces of the pole shoes and of the circumferential side surfaces of the target onto a plane parallel to the sputtering surface have a distance from one another in the sense of a nonoverlap.

6. The magnetron cathode of claim 1, wherein the magnet system including its magnet yoke is electrically insulated from the target and from the pole shoes.

7. The magnetron cathode of claim 1, wherein the metal body is meander-shaped in cross section.

8. The magnetron cathode of claim 1, wherein ferromagnetic bodies are inserted as flux guides between the pole shoes and the heat-conducting metal body.

* * * * *